US012663488B2

(12) United States Patent
Dubroca et al.

(10) Patent No.: US 12,663,488 B2
(45) Date of Patent: Jun. 23, 2026

(54) ROTOR CAP REMOVING TOOLS, MICROWAVE GUIDES, AND METHODS

(71) Applicant: The Florida State University Research Foundation, Inc., Tallahassee, FL (US)

(72) Inventors: Thierry Dubroca, Tallahassee, FL (US); Bianca Trociewitz, Tallahassee, FL (US); Johannes McKay, Tallahassee, FL (US); Frederic Mentink-Vigier, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 311 days.

(21) Appl. No.: 18/353,733

(22) Filed: Jul. 17, 2023

(65) Prior Publication Data

US 2023/0358830 A1     Nov. 9, 2023

Related U.S. Application Data

(62) Division of application No. 17/104,057, filed on Nov. 25, 2020, now Pat. No. 11,703,555.

(60) Provisional application No. 62/939,766, filed on Nov. 25, 2019.

(51) Int. Cl.
*G01R 33/30*     (2006.01)
*G02B 6/00*     (2006.01)

(52) U.S. Cl.
CPC ............ *G01R 33/307* (2013.01); *G02B 6/00* (2013.01)

(58) Field of Classification Search
CPC ... G01R 33/307; H01Q 13/12; H01Q 21/0056
See application file for complete search history.

(56) References Cited

U.S. PATENT DOCUMENTS

| | | | | |
|---|---|---|---|---|
| 4,197,549 A | * | 4/1980 | Collins | H01Q 21/0062 |
| | | | | 343/791 |
| 4,297,706 A | * | 10/1981 | Nikolayuk | H01Q 21/24 |
| | | | | 343/771 |
| 4,429,290 A | * | 1/1984 | Devan | H01P 3/14 |
| | | | | 333/241 |
| 4,742,271 A | * | 5/1988 | MacMaster | H01J 25/42 |
| | | | | 315/5.35 |
| 2019/0334247 A1 | * | 10/2019 | Tong | H01Q 13/085 |

\* cited by examiner

*Primary Examiner* — Chad H Smith
(74) *Attorney, Agent, or Firm* — Eversheds Sutherland (US) LLP

(57) ABSTRACT

Apparatuses and methods for removing caps, such as NMR rotor caps. The apparatuses and methods may permit caps to be removed in a manner that minimizes damage to equipment and instruments. Microwave waveguides that may include an elongated waveguide, a spline horn, and a slotted waveguide. Analytical instruments that include the waveguides.

15 Claims, 5 Drawing Sheets

200

230

210

220

230

300

330

340

320

310

500

520

5B

530

510

5B

510

530

520

ROTOR CAP REMOVING TOOLS, MICROWAVE GUIDES, AND METHODS

CROSS-REFERENCE TO RELATED APPLICATIONS

This application is a divisional application of U.S. patent application Ser. No. 17/104,057, filed Nov. 25, 2020, now U.S. Pat. No. 11,703,555, which claims priority to U.S. Provisional Patent Application No. 62/939,766, filed Nov. 25, 2019. The content of these applications is incorporated by reference herein.

STATEMENT REGARDING FEDERALLY SPONSORED RESEARCH AND DEVELOPMENT

This invention was made with government support under contracts DMR-1644779, DMR-1157490, and CHE-1229170, awarded by the National Science Foundation. The government has certain rights in the invention.

BACKGROUND

Nuclear magnetic resonance (NMR) rotors may be used to hold samples during a number of tests, such as magic angle spinning NMR experiments. NMR rotors usually are small cylindrical cups with thin walls, typically made of hard ceramics. After filling a cup with a sample, a cap can be added to close the cup before NMR experiments take place. The caps typically are made of plastic, and are pressed for a tight seal with a cup.

When an experiment is finished, the sample may be removed from the rotor. The first step is usually very delicate, and includes removing the cap without damaging the cap and/or rotor. The cap is designed to stick out of the rotor, and a manufacturer or designer of the rotors and caps usually provide a tool which can grab the cap.

The normal operation is to hold the rotor from one side and pull from the other side using the cap-grabbing tool. If this operation is not performed in a straight fashion, damage usually occurs. For example, the cap can crack the rotor. Sometimes the crack is of such a small size that it is not visible to the naked eye. In such cases, the rotor can crash in the NMR probe during operation, which may cause significant damage, such as damaging the stator, and the sample and rotor usually are lost as well.

Such crashes can be extremely expensive (e.g., stators can cost tens of thousands of dollars, some samples can take week or months for scientists to make, etc.).

Therefore, there remains a need for improved apparatuses for removing the caps, including apparatuses that ensure cap removal is consistently performed in a straight manner.

To perform dynamic nuclear polarization, one needs a NMR spectrometer in combination with a microwave source and microwave guiding system to irradiate the sample under study during NMR experiments. In particular, maintaining low loss microwave transport inside the NMR probe can be difficult due to space, sample size, sample holder design limitation, or a combination thereof. The traditional approach has been to use corrugated waveguides and launch the microwave beam from a distance onto the sample holder.

Specifically, dynamic nuclear polarization probes typically use a corrugated waveguide and free space launch (sometimes in combination with a lens). Such apparatuses usually are complex, difficult to manufacture, and/or the launching of the microwave onto the sample under study is very inefficient, which may cause a high amount of microwave power loss. In fact, current technology can be so complex that manufacturing certain parts can take 6 to 8 weeks of processing, require the use of sacrificial parts, and be very expensive. Contributing to the expense is the high failure rate during manufacturing. Due to the high failure rate, several parts usually need to be fabricated in order to obtain one acceptable part.

There remains a need for improved microwave transport efficiency, and apparatuses that are low loss, are simple to manufacture, have a lower cost of manufacture, use less material during manufacturing, or a combination thereof.

BRIEF SUMMARY

Provided herein are apparatuses and methods that address one or more of the foregoing disadvantages. For example, improved apparatuses and methods are provided for removing caps, such as caps of NMR rotors, including apparatuses and methods that ensure cap removal is consistently performed in a straight manner that eliminates or reduces the risk of damage to one or more components and/or instruments.

Also provided herein are electromagnetic radiation wave guides, including a smooth wall microwave guide with extremely low loss that may be small enough to fit inside an NMR probe. In some embodiments, the smooth wall microwave guides are not corrugated, and, therefore, can be simpler to manufacture. In some embodiments, the microwave guides provided herein allow the guiding of microwaves inside a dynamic nuclear polarization probe with minimal or reduced losses. The guides may allow substantially lossless microwave transmission, and/or are easier (and, therefore, less expensive) to manufacture than current technology.

In one aspect, apparatuses that may be used for removing a cap, such as a cap from an NMR rotor, are provided. In some embodiments, the apparatuses include a plate having a first side and a second side, wherein the plate includes a material defining a first aperture of the first side of the plate; a tightening screw configured to reduce or expand a cross-sectional area of the first aperture; and at least one pushing screw arranged in at least one second aperture defined by the material, wherein each of the at least one pushing screws includes (i) a first end extending from the second side of the plate, and (ii) a second end that is extendible from the first side of the plate upon turning the first end.

In another aspect, methods for removing a cap, such as a cap from an NMR rotor, are provided. In some embodiments, the methods include providing a cap-removing apparatus as described herein; arranging at least a portion of an NMR rotor cap at least partially in the first aperture; turning the tightening screw to reduce the cross-sectional area of the first aperture to secure the NMR rotor cap in the first aperture; and turning the first end of the at least one pushing screw to extend the second end of the at least one pushing screw from the first side of the plate to apply a force to the NMR rotor with the second end of the at least one pushing screw, wherein the force is effective to separate the NMR rotor cap from the NMR rotor.

In a further aspect, slotted waveguides are provided. In some embodiments, the slotted waveguides include a metallic tube having a first end and a second end, wherein the metallic tube defines a plurality of slots in a surface of the metallic tube, and wherein the first end of the metallic tube is configured to be coupled to a device for directing or controlling electromagnetic radiation, such as microaves.

The second end of a slotted waveguide may be configured to receive a sample tube, such as a sample tube formed at least in part of a dielectric material. Non-limiting examples of dielectric materials include plastic, glass, ceramic, or a combination thereof. The dielectric material may be "microwave transparent", as described herein.

In a still further aspect, microwave guides are provided. In some embodiments, the microwave guides include a slotted waveguide as described herein; a spline horn coupled to the first end of the slotted waveguide; and an elongated waveguide coupled the spline horn, the elongated waveguide including a tube having a substantially smooth inner surface. The spline horn may be configured to focus a diameter of a beam of electromagnetic radiation, such as a microwave beam, from the elongated waveguide down to an internal diameter of the slotted waveguide.

In yet another aspect, analytical apparatuses are provided that include a slotted waveguide or microwave guide as described herein.

Additional aspects will be set forth in part in the description which follows, and in part will be obvious from the description, or may be learned by practice of the aspects described herein. The advantages described herein may be realized and attained by means of the elements and combinations particularly pointed out in the appended claims. It is to be understood that both the foregoing general description and the following detailed description are exemplary and explanatory only and are not restrictive.

DETAILED DESCRIPTION

In one aspect, apparatuses and methods are provided that may be used to remove a cap, such as an NMR rotor cap. When the cap is an NMR rotor cap, the apparatuses and methods herein may permit the cap to be removed without damaging caps, rotors, and/or components of an instrument. Cap-Removal Apparatuses and Methods In some embodiments, the apparatuses provided herein include a plate having a first side and a second side. The plate generally may have any shape and size, including those explained herein.

In some embodiments, the plate is formed of a material defining a first aperture of the first side of the plate. The "first aperture of the first side" includes an aperture that is accessible via the first side of the plate. In some embodiments, the first aperture traverses the entire width of the plate, and, therefore, is accessible via the first side and the second side of the plate. The first aperture generally may have any shape. In some embodiments, the first aperture is circular in shape, as depicted, for example, at FIG. 1A. The first aperture may have any size that is effective to permit the receiving of a cap into the first aperture, and the tightening of the first aperture about the cap. In some embodiments, the first aperture may have a size effective to receive and tighten about a cap, such as an NMR rotor cap, having a diameter of about 3 mm to about 5 mm.

The plate may be formed of any material. The material may include a flexible (e.g., a polymeric material) and/or malleable (e.g., a metal) material that permits a first aperture to be reversibly tightened as described herein. In some embodiments, the material includes a metal.

In some embodiments, the material includes a polymeric material. In some embodiments, the material includes a metal and a polymeric material.

In some embodiments, the apparatuses include a tightening screw configured to reduce or expand a cross-sectional area of the first aperture.

In some embodiments, the apparatuses include at least one pushing screw arranged in at least one second aperture defined by the material from which a plate is formed. Each pushing screw may include (i) a first end extending from the second side of the plate, and (ii) a second end that is extendible from the first side of the plate upon turning the first end of the pushing screw. In some embodiments, the apparatuses feature 1, 2, 3, 4, 5, or more pushing screws. In some embodiments, the apparatuses include two pushing screws, i.e., a first pushing screw and a second pushing screw.

Figure 1A:
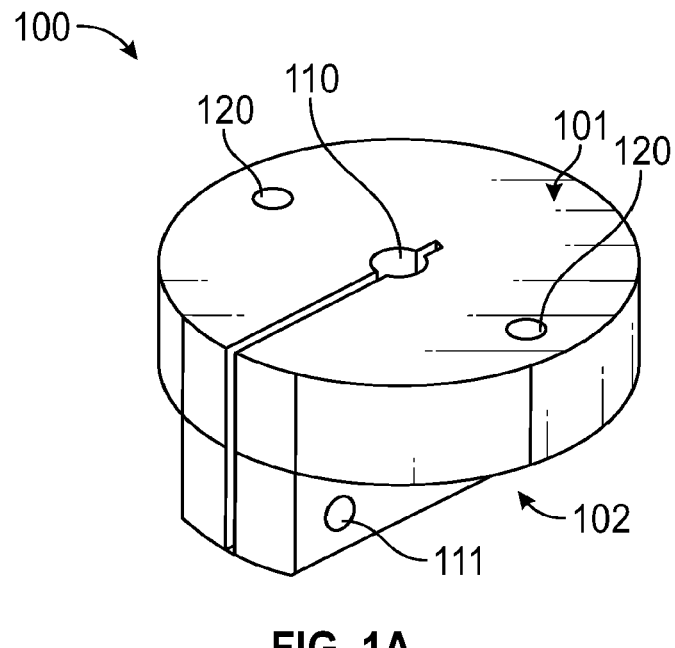
FIG. 1A depicts a perspective view of an embodiment of a plate for an embodiment of a cap-removing apparatus.
Figure 1B:
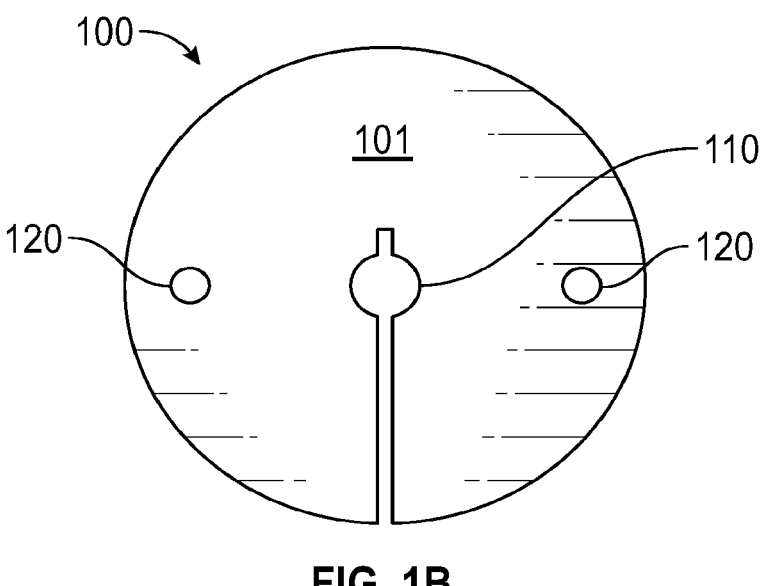
FIG. 1B depicts a bottom view of an embodiment of a plate for an embodiment of a cap-removing apparatus.
Figure 1C:
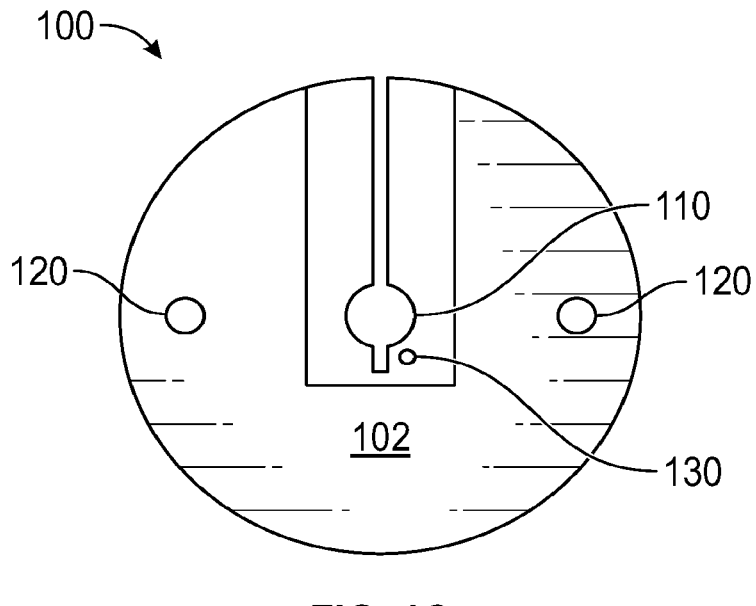
FIG. 1C depicts a top view of an embodiment of a plate for an embodiment of a cap-removing apparatus.
Figure 1D:
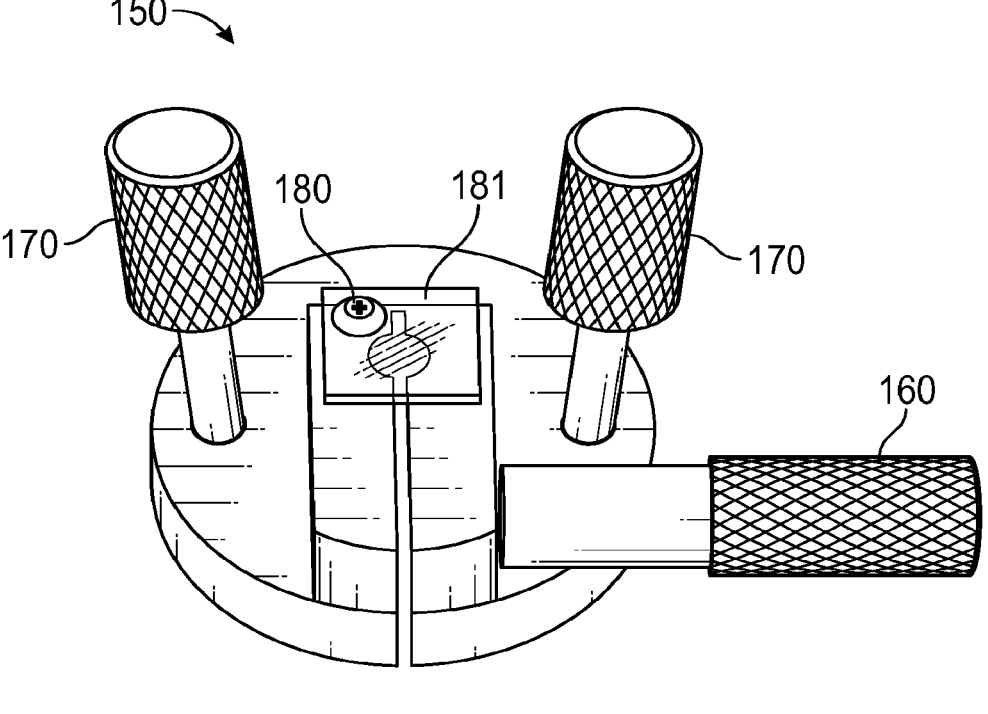
FIG. 1D depicts a perspective view of an embodiment of a cap-removing apparatus.

An embodiment of an apparatus is depicted at FIGS. 1A-1D. FIG. 1A depicts a perspective view of a plate, FIG. 1B depicts a bottom view of the plate, FIG. 1C depicts a top view of the plate 100, and FIG. 1D depicts a perspective view of the apparatus. The plate 100 of FIGS. 1A-1D has a first side 101 and a second side 102. The plate defines an aperture 110 of the first side 101 of the plate 100. The plate 100 also defines an aperture 111 configured to accommodate a tightening screw (see FIG. 1D). The plate 100 also defines two apertures 120, each of which is configured to accommodate a pushing screw (see FIG. 1D). The plate 100 also defines an aperture 130 that can optionally accommodate a screw or other fastener to permit the attachment of an accessory to the plate 100, such as a protective film (see FIG. 1D). FIG. 1D depicts a perspective view of an embodiment of an apparatus 150 that includes the plate 100 of FIGS. 1A-1C in which a tightening screw 160 is arranged in aperture 111, and a pushing screw 170 is arranged in each of the "second apertures" 120. The embodiment of the apparatus 150 depicted at FIG. 1D also includes a screw 180 arranged in aperture 130. The screw 180 secures a protective film 181 to the apparatus 150.

Although the plate of FIGS. 1A-1D has a first side that is circular shape (see FIG. 1B), other shapes are envisioned, such as square, rectangular, oval, etc. The plate, including its first side, generally may have any dimensions. In some embodiments, the largest dimension of the plate (e.g., the diameter of the first side of a plate when the first side is circular) is about 0.75 inches to about 1.5 inches, or about 0.9 inches to about 1.1 inches. Other dimensions, however, are envisioned. Although the pushing screws depicted at FIGS. 1A-1D are threaded screws, other configurations are envisioned, including non-threaded screws (e.g., bolts).

Also provided herein are methods for removing a cap. In some embodiments, the methods include providing a cap-removing apparatus as described herein; arranging at least a portion of an NMR rotor cap at least partially in the first aperture; turning the tightening screw to reduce the cross-sectional area of the first aperture to secure the NMR rotor cap in the first aperture; and turning the first end of the at least one pushing screw to extend the second end of the at least one pushing screw from the first side of the plate to apply a force to the NMR rotor with the second end of the at least one pushing screw, wherein the force is effective to separate the NMR rotor cap from the NMR rotor.

In some embodiments, the cap-grabbing apparatus includes more than one pushing screw, and the two or more pushing screws are turned simultaneously, alternately, or a combination thereof. In some embodiments, the cap-grabbing apparatus includes a first pushing screw and a second pushing screw, and the first ends of the first pushing screw and the second pushing screw are turned simultaneously, alternately, or a combination thereof.

In some embodiments, the cap removed by the methods described herein is an NMR rotor cap. The NMR rotor cap, in some embodiments, has a diameter of about 3 mm to about 5 mm, about 3 mm to about 4 mm, or about 3.2 mm. Other sizes are envisioned, however, because the dimensions of a first aperture and/or a plate, as described herein, can be altered to accommodate a variety of sizes.

Microwave Waveguides

Also provided herein are microwave guides that are configured, in some embodiments, to steer a beam at a sample in a confined space within a magnetic resonance spectrometer.

Also provided herein are slotted waveguides. In some embodiments, the slotted waveguides include a metallic tube having a first end and a second end, wherein the metallic tube defines a plurality of slots in a surface of the metallic tube, and wherein the first end of the metallic tube is configured to be coupled to a device for directing or controlling electromagnetic radiation, such as microwaves. The slotted waveguides may have a substantially smooth inner surface.

As used herein, the term "slot" refers to an aperture (i) defined by a metallic tube of a slotted waveguide, and (ii) having a length at least 5 times, at least 10 times, at least 25 times, at least 50 times, or at least 100 times greater than its width. The slots may be located at any one or more portions of a surface of a slotted waveguide. In some embodiments, slots are present along the full length of a metallic tube, or along a portion of the metallic tube. The slotted waveguides, including the slots thereof, may be configured to allow the propagation of TE11 mode microwave beams with low losses.

The slots of a slotted waveguide may have uniform dimensions, or a plurality of slots may include slots having different dimensions. The slots may be designed to be thin enough compared to the wavelength of the microwaves to not interfere with the beam propagation along the largest dimension of the guide, and slots may be long enough to allow radio frequency waves to travel perpendicularly to the length of the waveguide with limited losses.

In some embodiments, each slot of the plurality of slots has a width that is about 4 to about 6 times smaller than a wavelength of a microwave beam. In some embodiments, each slot of the plurality of slots has a width that is about 5 times smaller than a wavelength of a microwave beam. In some embodiments, each slot of the plurality of slots has a width of about 120 $\mu$m to about 130 $\mu$m. In some embodiments, each slot of the plurality of slots has a width of about 125 $\mu$m. The slots generally may be dimensioned to be relatively long, such that the Eddy currents are reduced or minimized (and thus reduce radio frequency (RF) losses while the RF waves travel through the slotted waveguide). The slots also may be dimensioned to be very thin (e.g., about 5 times smaller than the wavelength of the microwave), such that the microwave traveling in the longitudinal direction do not "see" the slots.

In some embodiments, the slots are 125 $\mu$m wide, and the wavelength of the microwave is 760 $\mu$m, thus the slotted waveguide appears as if it is a solid cylinder to the microwave beam. This particular design can maximize both the RF and microwave power at the sample. In order to prevent arcing from the RF wave (arcing between the NMR coil and the slotted waveguide) a tube of quartz, as described herein, may be placed around the slotted guide to act as an insulator.

Each slot may be independently oriented at any angle relative to a longitudinal axis of a metallic tube. In some embodiments, each slot of the plurality of slots has a length that is oriented perpendicularly to a longitudinal axis of the metallic tube.

In some embodiments, the slotted waveguides provided herein also include a sample tube. The sample tube, in some embodiments, is configured to be inserted at least partially into the second end of the slotted waveguide. The sample tube may be formed at least in part of a dielectric material. For example, a sample tube may be formed entirely of a dielectric material, or a portion of the sample tube, such as the portion inserted into a slotted waveguide, may be formed of a dielectric material.

Figures 2, 3:
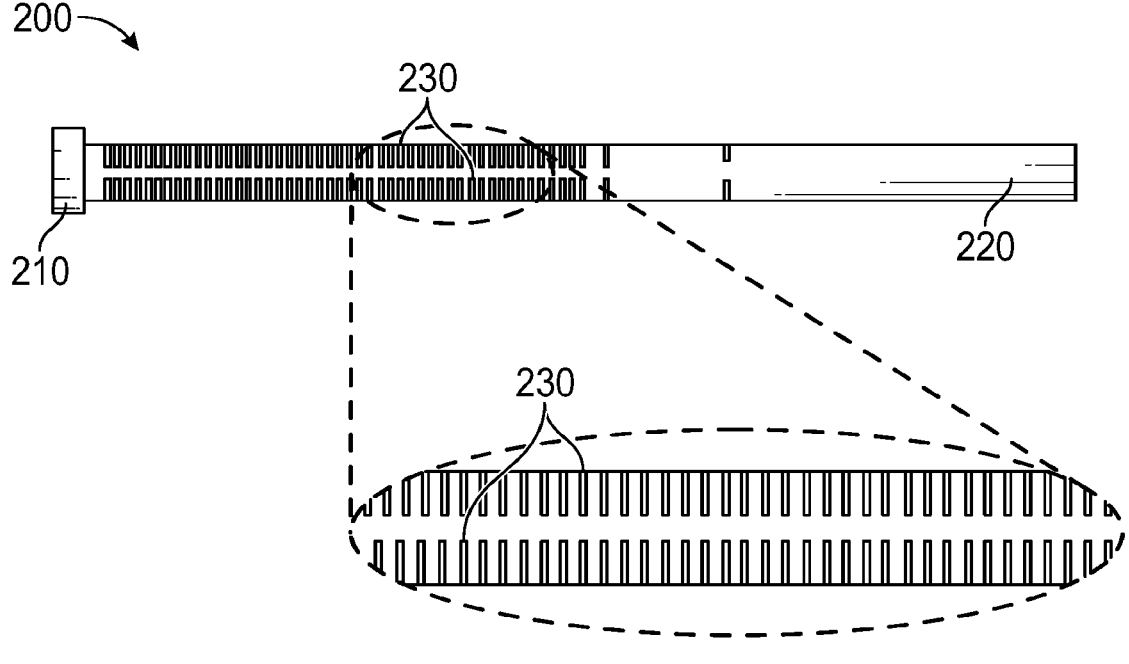
FIG. 2 depicts an embodiment of a slotted waveguide.
FIG. 3 depicts an embodiment of a slotted waveguide, and an embodiment of a sample tube partially inserted into the slotted waveguide.

An embodiment of a slotted waveguide is depicted at FIG. 2. The slotted waveguide 200 of FIG. 2 is a metallic tube having a first end 210 and a second end 220. The metallic tube defines a plurality of slots 230 in opposing surfaces of the metallic tube. A portion of the metallic tube is enlarged to show the plurality of slots 230. The slotted waveguide 200 of FIG. 2 includes 60 slots at or near the middle of the waveguide. When the slotted waveguide of FIG. 2 is used, a sample tube may be completely inserted in the second end 220 of the metallic tube.

Another embodiment of a slotted waveguide is depicted at FIG. 3. The slotted waveguide 300 of FIG. 3 has a shorter length than the device of FIG. 2. The slotted waveguide 300 of FIG. 3 is a metallic tube having a first end 310 and a second end 320. The metallic tube defines a plurality of slots 330 in a surface of the metallic tube. The slotted waveguide 300 of FIG. 3 is 3.4 mm in diameter and about 20 mm long. Its larger base at the first end 310 is 5 mm in diameter and includes a bevel to self-center when assembled within a measurements probe. The slots 330 in the slotted waveguide 300 are about ¾ around the periphery of the metallic tube with an opening of 100 $\mu$m and a gap between openings twice the opening width.

Also depicted at FIG. 3 is a sample tube 340, which is partially inserted into the second end 320 of the slotted waveguide 300. When the slotted waveguide depicted at FIG. 3 is used, about 1 mm to about 5 mm of the sample tube 340 may be inserted into the second end 320 of the metallic tube. The sample tube 340 of FIG. 3 has a diameter of about 3 mm, and a length of about 30 mm, although other dimensions are envisioned. In some embodiments, the sample tube 340 is formed of a dielectric material, which is transparent to microwaves. Using a transparent dielectric sample tube allows, in some embodiments, a microwave beam to propagate continuously from the metallic guide to the dielectric sample tube itself. This design can maintain the same low loss microwave propagation as the device of FIG. 2, but the radio frequency irradiation can be performed from any angle. The device of FIG. 2 can limit the radio frequency irradiation direction due to the spine needed to mechanically hold the metallic guide together. Without the spine, radio frequencies can be directed at the sample from multiple directions at the same time without any losses. The device of FIG. 3, therefore, has a design that may offer new applications, such as the possibility of performing two-dimensional NMR measurements due to multi-direction radio frequency irradiation without any interference. In some embodiments, microwaves travel from the first end 310 through the slotted waveguide and into the sample tube 340, thereby allowing irradiation of the sample. The sample also can be irradiated with beams coming from perpendicular directions to the propagation of the guided microwaves.

Also provided herein are microwave guides that include a slotted waveguide as described herein; a spline horn coupled to the first end of the slotted waveguide; and an elongated waveguide coupled the spline horn.

In some embodiments, the elongated waveguide includes a tube having a substantially smooth inner surface. In some embodiments, the elongated waveguide has an inner diameter of about 0.4 inches to about 0.5 inches.

In some embodiments, the elongated waveguide has an inner diameter configured to correspond to an incoming microwave beam generated by a separate microwave source and a quasi-optical transport table.

The spline horn may be configured to focus a diameter of a beam of electromagnetic radiation from the elongated waveguide down to an internal diameter of the slotted waveguide. In some embodiments, the spline horn includes a substantially smooth inner surface. The spline horn may have a substantially smooth inner surface.

The spline shape of a spline horn may be modified to match the impedance of an incoming microwave beam at the base of the probe (when the impedance matches, the reflection of the beam is zero). In some embodiments, impedance matching is part of the design, and can make the entire waveguide lossless. The spline of the spine horn and the elongated waveguide may be shaped to turn the Gaussian shaped input beam into a TE11 mode beam at its output. The TE11 mode microwave beam then can continuously propagate into the slotted waveguide with minimal losses.

In some embodiments, the guides also include a tube of quartz arranged at least partially around the slotted waveguide. A tube of quartz placed around the slotted waveguide during NMR measurements can remove possible electrical grounding (i.e. generate electrical arcs) via the slotted waveguide.

Figure 4:
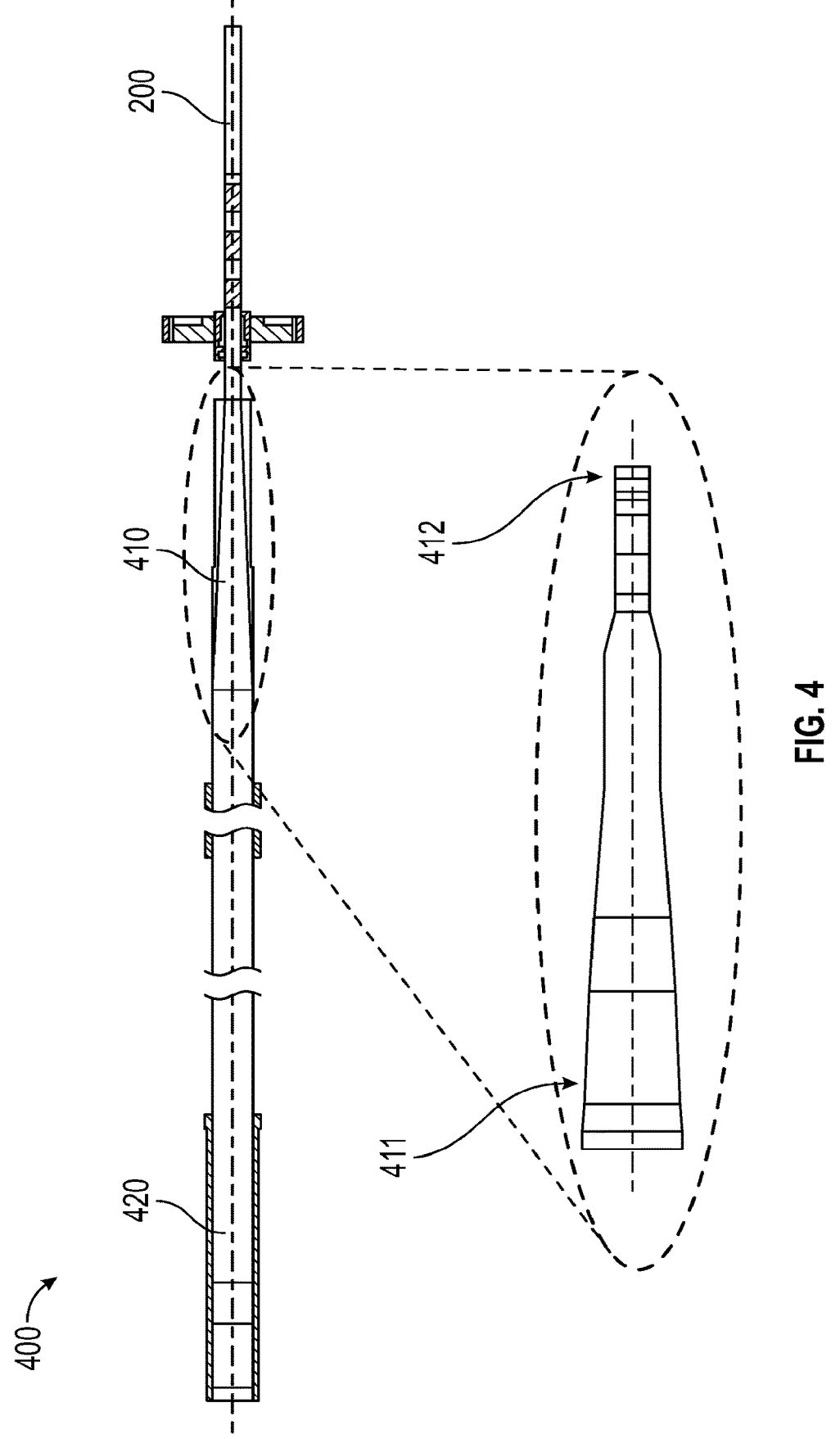
FIG. 4 depicts an embodiment of a microwave guide that may be used in an analytical technique.

An embodiment of a microwave guide is depicted at FIG. 4. The guide 400 of FIG. 4 includes the slotted waveguide 200 of FIG. 2, a spline horn 410 coupled to the first end of the slotted waveguide 200; and an elongated waveguide 420 coupled the spline horn 410. The elongated waveguide 420 depicted at FIG. 4 has an inner diameter of 0.414 inches. The spline horn 410 includes a larger inner diameter at the end 411 coupled to the elongated waveguide 420, and a smaller inner diameter at the end 412 coupled to the slotted waveguide 200. This gradient may be configured to focus a diameter of a beam of electromagnetic radiation from the elongated waveguide down to an internal diameter of the slotted waveguide. Although the slotted waveguide 200 of FIG. 2 is depicted in the embodiment of FIG. 4, the slotted waveguide 200 of FIG. 2 may be replaced with the slotted waveguide 300 of FIG. 3 in other embodiments. The slotted waveguide 200 depicted at FIG. 4 had an inner diameter of 0.118 inches.

In some embodiments, the microwave guide provided herein may include an adaptor configured to provide cooling to the sample. The adaptor, for example, may be configured such that a cooling gas can be flown through the waveguide all the way to the sample. Although a portion of a gas may flow out through the first few slots of a slotted waveguide, the gas may keep flowing between a quartz tube and a slotted waveguide to cool the sample.

Figure 5A:
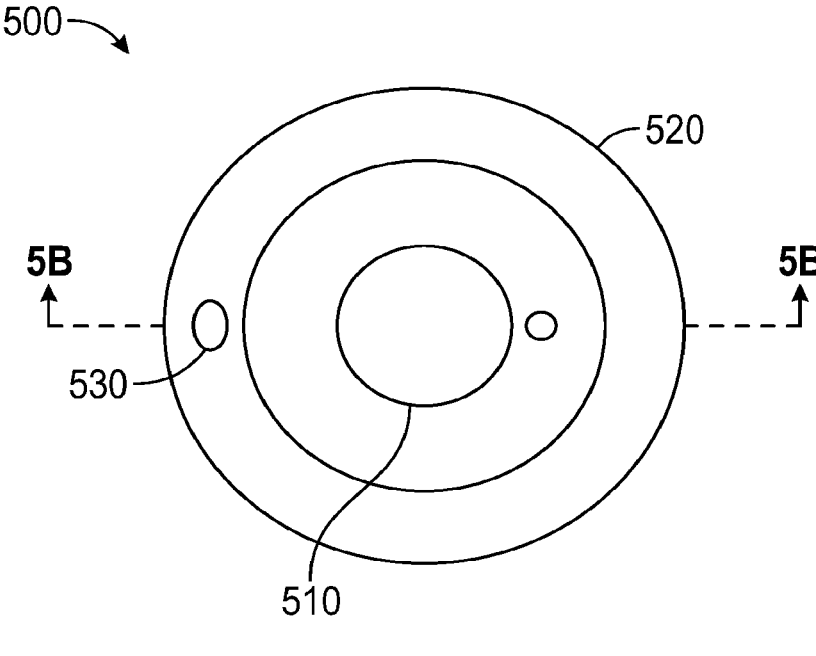
FIG. 5A depicts a top view of an embodiment of an adapter described herein.
Figure 5B:
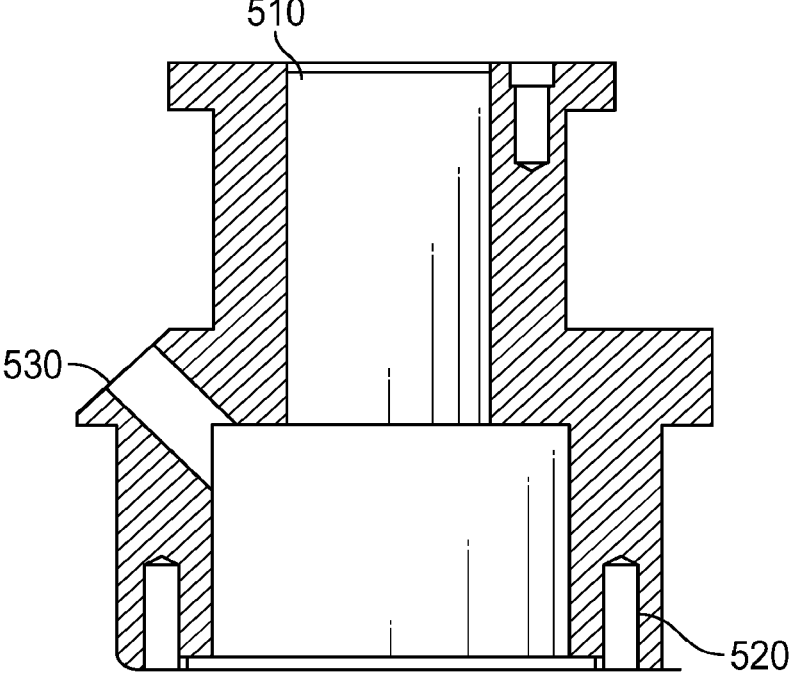
FIG. 5B depicts a cross-section of the embodiment of the adapter depicted at FIG. 5A.

An embodiment of an adapter is depicted at FIG. 5A (top view) and FIG. 5B (cross-sectional view). The adapter 500 includes a first end 510 and a second end 520 configured to accommodate components of the apparatuses provided herein. The adapter 500 defines an orifice 530 through which a gas may be provided.

An adapter also may include one or more windows arranged in or on the adapter. In some embodiments, the one or more windows are transparent (e.g., have a very low absorption) to microwaves in order to minimize reflections. For example, the thickness of a window may be about 1.5 times the wavelength of the microwave). Such a material may be chosen for its low index of refraction and its low loss to maximize transmission. An adaptor also may serve, in some embodiments, as an alignment pin to align the Gaussian microwave beam propagating toward the NMR probe waveguide, thus ensuring perfect matching conditions (i.e. zero reflection losses) in some embodiments.

Also provided herein are analytical apparatuses that include the slotted waveguides or other apparatuses, such as microwave guides, described herein. In some embodiments, the microwave guide is arranged in an NMR probe. In some embodiments, the microwave guide is arranged in a liquid dynamic nuclear polarization (DNP) probe.

For DNP applications, the microwave beam may interact with the sample (which may be placed in the center of the slotted waveguide) while at the same time allowing RF waves to also interact with the sample.

In modern high-resolution NMR spectrometers, the RF waves are generated by a radial (orientation relative to the NMR magnet) NMR saddle coil situated around the sample (in some embodiments herein, around the slotted waveguide). The slots in the slotted waveguide may be designed to allow the RF waves to travel freely through the waveguide and interact with the sample as if the slotted waveguide was transparent.

In some embodiments, the design/set-up increases the microwave beam power at the sample by several folds compared to the alternative method (e.g., use of a corrugated waveguide and launch of the beam toward the sample with the help of a lens). The apparatuses described herein, in some embodiments, are also simpler to manufacture than fabricating corrugated waveguide and horns for this application, thus reducing the manufacturing costs.

In the descriptions provided herein, the terms "includes," "is," "containing," "having," and "comprises" are used in an open-ended fashion, and thus should be interpreted to mean "including, but not limited to." When methods and devices are claimed or described in terms of "comprising" various components or steps, the devices and methods can also "consist essentially of" or "consist of" the various components or steps, unless stated otherwise.

The terms "a," "an," and "the" are intended to include plural alternatives, e.g., at least one. For instance, the disclosure of "a plate," "a tightening screw," "a metal," and the like, is meant to encompass one, or mixtures or combinations of more than one plate, tightening screw, metal, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, numerical end points of ranges disclosed herein are approximate. As a representative example, Applicant discloses that, in some embodiments, each slot of the plurality of slots has a width of about 120 μm to about 130 μm. This disclosure should be interpreted as encompassing values of about 120 μm to about 130 μm, and further encompasses "about" each 121 μm, 122 μm, 123 μm, 124 μm, 125 μm, 126 μm, 127 μm, 128 μm, and 129 μm, including any ranges and sub-ranges between any of these values.

The present embodiments are illustrated herein by referring to various embodiments, which are not to be construed in any way as imposing limitations upon the scope thereof. On the contrary, it is to be understood that resort may be had to various other aspects, embodiments, modifications, and equivalents thereof which, after reading the description herein, may suggest themselves to one of ordinary skill in the art without departing from the spirit of the present embodiments or the scope of the appended claims. Thus, other aspects of the embodiments will be apparent to those skilled in the art from consideration of the specification and practice of the embodiments disclosed herein.

We claim:

1. A slotted waveguide comprising:
a metallic tube having a first end and a second end; and
a sample tube inserted partially into the second end of the metallic tube;
wherein the metallic tube defines a plurality of slots in a surface of the metallic tube, wherein each slot of the plurality of slots consists of a linear slit having a length, a width, and a thickness, wherein the length exceeds the width, the length exceeds the thickness, and every length of the plurality of slots is oriented perpendicularly to a longitudinal axis of the metallic tube, and wherein the first end of the metallic tube is configured to be coupled to a device for directing or controlling electromagnetic radiation, and wherein the metallic tube is not corrugated.

2. The slotted waveguide of claim 1, wherein each slot of the plurality of slots has a width that is about 4 to about 6 times smaller than a wavelength of a microwave beam.

3. The slotted waveguide of claim 1, wherein each slot of the plurality of slots has a width of about 120 μm to about 130 μm.

4. The slotted waveguide of claim 1, wherein each slot of the plurality of slots has a length that is at least 5 times greater than its width.

5. The slotted waveguide of claim 1, wherein each slot of the plurality of slots has a length that is at least 50 times greater than its width.

6. The slotted waveguide of claim 1, wherein the sample tube is formed at least in part of a dielectric material.

7. The slotted waveguide of claim 1, wherein the plurality of slots is present along a full length of the metallic tube.

8. The slotted waveguide of claim 1, wherein the plurality of slots consists of slots having uniform dimensions.

9. The slotted waveguide of claim 1, wherein the plurality of slots comprises slots having different dimensions.

10. A slotted waveguide comprising:
a metallic tube having a first end and a second end; and
a sample tube inserted partially into the second end of the metallic tube;
wherein the metallic tube defines a plurality of slots in a surface of the metallic tube, wherein each slot of the plurality of slots consists of a linear slit having a length, a width, and a thickness, wherein the length exceeds the width, the length exceeds the thickness, and every length of the plurality of slots is oriented perpendicularly to a longitudinal axis of the metallic tube, and wherein the first end of the metallic tube is configured to be coupled to a device for directing or controlling electromagnetic radiation, and wherein the metallic tube is not corrugated;
wherein each slot of the plurality of slots has a width of about 120 μm to about 130 μm; and
wherein each slot of the plurality of slots has a length that is at least 5 times greater than its width.

11. The slotted waveguide of claim 10, wherein each slot of the plurality of slots has a length that is at least 50 times greater than its width.

12. The slotted waveguide of claim 10, wherein the sample tube is formed at least in part of a dielectric material.

13. The slotted waveguide of claim 10, wherein the plurality of slots is present along the full length of the metallic tube.

14. The slotted waveguide of claim 10, wherein the plurality of slots consists of slots having uniform dimensions.

15. The slotted waveguide of claim 10, wherein the plurality of slots comprises slots having different dimensions.

* * * * *